United States Patent
Abe (10) Patent No.: US 9,811,417 B2
(45) Date of Patent: Nov. 7, 2017

(54) SEMICONDUCTOR MEMORY DEVICE

(71) Applicant: Toshiba Memory Corporation, Minato-ku, Tokyo (JP)

(72) Inventor: Masahiro Abe, Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/061,487

(22) Filed: Mar. 4, 2016

(65) Prior Publication Data
US 2016/0266973 A1    Sep. 15, 2016

Related U.S. Application Data

(60) Provisional application No. 62/132,412, filed on Mar. 12, 2015.

(51) Int. Cl.
| | |
|---|---|
| *G11C 29/00* | (2006.01) |
| *G06F 11/10* | (2006.01) |
| *H03M 13/27* | (2006.01) |
| *H03M 13/35* | (2006.01) |
| *G11C 29/04* | (2006.01) |

(52) U.S. Cl.
CPC ..... *G06F 11/1068* (2013.01); *H03M 13/2732* (2013.01); *H03M 13/353* (2013.01); *G11C 2029/0411* (2013.01)

(58) Field of Classification Search
CPC .............. G06F 11/1068; H03M 13/353; G11C 2029/0411; G11C 16/3454; G11C 11/5642
USPC ....... 714/701, 702, 746, 747, 761–764, 756, 714/786, 787
See application file for complete search history.

(56) References Cited

U.S. PATENT DOCUMENTS

| | | | |
|---|---|---|---|
| 6,791,955 B1 | 9/2004 | Kikuchi et al. | |
| 2007/0171714 A1 | 7/2007 | Wu et al. | |
| 2009/0183052 A1 | 7/2009 | Kanno et al. | |
| 2010/0146229 A1* | 6/2010 | Yang | G06F 12/0207 711/157 |
| 2010/0251075 A1 | 9/2010 | Takahashi et al. | |
| 2013/0254625 A1* | 9/2013 | Vlaiko | G06F 11/1044 714/763 |
| 2015/0256202 A1* | 9/2015 | Park | H03M 13/1165 714/762 |
| 2016/0049963 A1* | 2/2016 | Taylor | H03M 13/2732 714/786 |

FOREIGN PATENT DOCUMENTS

JP    2000-269828 A    9/2000

OTHER PUBLICATIONS

Masahiro Abe et al., "The effective interleaving scheme against the shadowing in S-Band Digital Mobile Satellite Broadcasting System," IEEE, pp. 1793-1797, May 15-18, 2000.

* cited by examiner

*Primary Examiner* — Christine Tu
(74) *Attorney, Agent, or Firm* — White & Case LLP (57) ABSTRACT

According to one embodiment, a semiconductor memory device includes an encoder configured to generate an error correction code with respect to data, a processor configured to perform interleaving with respect to the data output from the encoder after the generation of the error correction code by the encoder, and a memory configured to store a process result from the processor.

12 Claims, 5 Drawing Sheets

| Interleaving | | Deinterleaving | |
| --- | --- | --- | --- |
| Paths | delay | Paths | delay |
| 1 | 0 | 1 | $(n-1) \times d = (3k-1) \cdot d$ |
| 2 | $(n \times 1/3) \times d = k \cdot d$ | 2 | $(n \times 2/3 - 1) \times d = (2k-1) \cdot d$ |
| 3 | $(n \times 2/3) \times d = 2k \cdot d$ | 3 | $(n \times 1/3 - 1) \times d = (k-1) \cdot d$ |
| 4 | $d$ | 4 | $(n-2) \times d = (3k-2) \cdot d$ |
| 5 | $(n \times 1/3 + 1) \times d = (k+1) \cdot d$ | 5 | $(n \times 2/3 - 2) \times d = (2k-2) \cdot d$ |
| 6 | $(n \times 2/3 + 1) \times d = (2k+1) \cdot d$ | 6 | $(n \times 1/3 - 2) \times d = (k-2) \cdot d$ |
| 7 | $2d$ | 7 | $(n-3) \times d = (3k-3) \cdot d$ |
| 8 | $(n \times 1/3 + 2) \times d = (k+2) \cdot d$ | 8 | $(n \times 2/3 - 3) \times d = (2k-3) \cdot d$ |
| 9 | $(n \times 2/3 + 2) \times d = (2k+2) \cdot d$ | 9 | $(n \times 1/3 - 3) \times d = (k-3) \cdot d$ |
| ⋮ | ⋮ | ⋮ | ⋮ |
| n-2 | $(n \times 1/3 - 1) \times d = (k-1) \cdot d$ | n-2 | $(n \times 2/3 + 1) \times d = 2k \cdot d$ |
| n-1 | $(n \times 2/3 - 1) \times d = (2k-1) \cdot d$ | n-1 | $(n \times 1/3 + 1) \times d = k \cdot d$ |
| n | $(n-1) \times d = (3k-1) \cdot d$ | n | 0 |

SEMICONDUCTOR MEMORY DEVICE

CROSS-REFERENCE TO RELATED APPLICATIONS

This application claims the benefit of U.S. Provisional Application No. 62/132,412, filed Mar. 12, 2015, the entire contents of which are incorporated herein by reference.

FIELD

Embodiments described herein relate generally to a semiconductor memory device.

BACKGROUND

Semiconductor memory devices with a memory which stores data using error correction are provided.

DETAILED DESCRIPTION

Various embodiments will be described hereinafter with reference to the accompanying drawings.

In general, according to one embodiment, a semiconductor memory device includes an encoder configured to generate an error correction code with respect to data, a processor configured to perform interleaving with respect to the data output from the encoder after the generation of the error correction code by the encoder, and a memory configured to store a process result from the processor.

In the following description, some elements are introduced with different referential expressions.

These referential expressions are simply for the exemplification sake, and these elements may be referred to by different expressions. Furthermore, elements which are referred to by the determined expression may be referred to by different expressions as well.

Hereinafter, embodiments will be explained with reference to the accompanying drawings.

Figure 1:
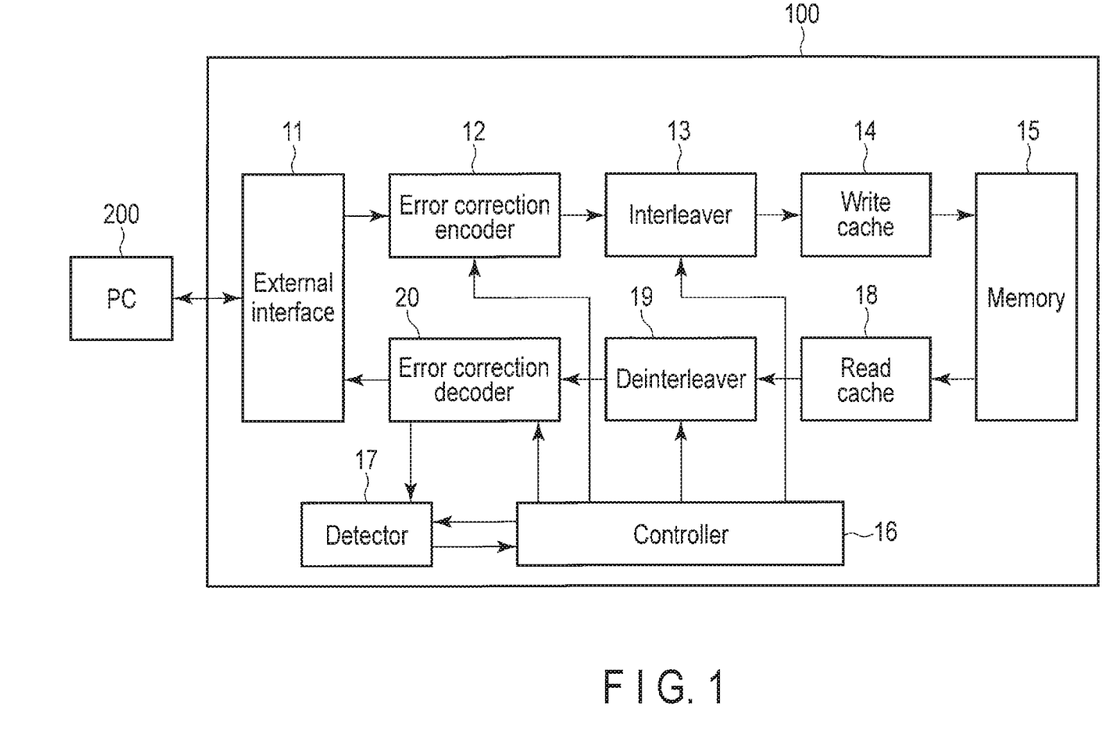
FIG. 1 shows an example of a main structure of a semiconductor memory device of an embodiment.

FIG. 1 shows an example of the entire structure of a semiconductor memory device 100. The semiconductor memory device 100 is, for example, a solid-state drive (SSD). Furthermore, the semiconductor memory device 100 is connected to transmit/receive data to/from an information processing apparatus such as personal computer (PC) 200 and the like.

The semiconductor memory device 100 includes an external interface 11, error correction encoder 12, interleaver 13, write cache 14, memory 15, controller 16, detector 17, read cache 18, deinterleaver 19, and error correction decoder 20.

The external interface 11 controls data transmission and reception with the PC 200.

The error correction encoder 12 executes error correction encoding with respect to data received via the external interface 11. Furthermore, the error correction encoder 12 outputs the data subjected to the error correction encoding to the interleaver 13.

The error correction encoder 12 generates an error correction code (FCC) for per predetermined area, for example, per block used in a NAND flash memory (NAND block). Here, the NAND block is a unit to erase the data in the NAND flash memory. When generating the error correction codes, the error correction encoder 12 uses encoder block length $\alpha$ and error correction parity length $\beta$ as their parameters.

The interleaver 13 executes interleaving with respect to the data from the error correction encoder 12. At the time of data transfer, the interleaves 13 divides the original data by a predetermined unit or a predetermined period (hereinafter referred to as interleaving). The data subjected to interleaving are later returned to the original data order by the deinterleaver 19 (hereinafter referred to as deinterleaving). When interleaving is executed, the data decoding time is delayed; however, the error detection/correction performance is still improved since error positions are dispersed discontinuously in the data after deinterleaving even if there is a burst error which focuses in a certain position of the data subjected to interleaving. In the present embodiment, convolutional interleaving is exemplified as interleaving. Furthermore, the interleaver 13 outputs the data subjected to interleaving to the write cache 14.

Here, the burst error is, if it would occur in a communication channel, a data error caused by deterioration of the communication channel. In the burst error, there are two periods, one is a period in which the error occurs continuously for a long time and the other is a period in which no error occurs for a long time. More specifically, when the data are written/read to/from a memory, signals (data) are altered or lost in the write/read process because of the deterioration of the memory originated from various causes, and data errors occur. The burst error is a kind of data error in which an error continues for a long time because of the deterioration of the memory, and thus the data are clearly separated into two parts, that is, the part where the error occurs continuously for a long time and the part where no error occurs at all. Furthermore, if a bust error length exceeds an error correction performance that decodes a predetermined number of data, the decode cannot be performed properly. The predetermined number of the data varies depending on the burst error length and the error correction code length. Or, such a long term burst error which has a greater burst error length may be defined differently. For example, given that a state where no burst error occurs in a certain area is a first state, and a state where a long term burst error which has a greater burst error length is a second state, the first state shows BER=0, and the second state shows BER=0.5 (all bit error). BER will be described later.

The write cache 14 temporarily stores the data from the interleaver 13. Furthermore, the write cache 14 outputs the data temporarily stored to the memory 15.

The memory 15 stores process results from the write cache 14. Here, the process results are the data which have been subjected to error correction encoding by the error correction encoder 12, subjected to interleaving by the interleaver 13, and temporarily stored the write cache 14. Therefore, the memory 15 at least includes the data. Note that the memory 15 can store data other than the aforementioned data (for example, data used for management of a data storage area).

In this embodiment, the memory 15 is realized as a memory composed of a plurality of NAND flash memories. Furthermore, the memory 15 outputs the data to the read cache 18 based on an instruction from the PC 200.

Quality of the memory 15 (for example, quality the NAND flash memory) changes depending on how it is used by users. In the memory 15, for example, an area used frequently starts to decrease data storage quality. At the area of the memory 15 where the data storage quality is maintained relatively good (first area), bit errors that occur therein are few, and thus, there is no need of a high correction performance code. In that case, using such a high correction performance code is an excessive countermeasure. On the other hand, at the area of the memory 15 where the data storage quality is relatively poor (second area), there may be an error that cannot be corrected by the default error correction performance. In that case, the error correction performance is below specification. Note that, if a burst error occurs in a conventional semiconductor memory device, the burst error itself is decoded by an error correction decoder. Thus, if the burst error is a long term one, the data cannot be decoded simply by a parameter change of the error correction code or a change into an error correction code having a similar code length. That is, proper decode of data cannot be achieved by simply improving the error correction performance of a fixed code length. The semiconductor memory device 100 of the present embodiment can deal with this problem by a process executed by the controller 16 as described later in detail.

Based on the instruction from the controller 16, the detector 17 measures a bit error rate (BER) per predetermined unit time of the data decoded by the error correction decoder 20. Here, BER means an error rate (mean value) in data amount per unit time which is received while being affected by noise and the like. The detector 17 outputs a BER value (credibility value) detected thereby to the controller 16. Here, the credibility means, if data are read from a predetermined area of the memory 15 based on the instruction by the PC 200, whether or not at least the data read from the predetermine area have a BER value (credibility value) which can be corrected to error 0 within the error correction performance, and for example, such a BER value is 0.

Based on the BER value from the detector 17, the controller 16 changes the parameters of the error correction encoder 12, interleaver 13, deinterleaver 19, and error correction decoder 20 per predetermined area unit. More specifically, the controller 16 refers to the BER value corresponding to the data of predetermined area unit and adaptively changes the parameters of the interleaver 13 and the deinterleaver 19 (number of paths n and delay unit d). Furthermore, the controller 16 refers to the BER value corresponding to the data of predetermined area unit and adaptively changes the parameters of the error correction encoder 12 and the error correction decoder 20 (encoder block length α and correction parity length β).

Furthermore, the controller 16 adaptively changes the parameters of the interleaver 13 (number of paths n, delay unit d, k=n/3, encoder block length α and correction parity length β) corresponding to the burst error length.

For example, the controller 16 may set delay unit d=encoder block length α, or delay unit d=an integral multiple of encoder block length α. Then, the controller 16 sets a total delay time Dt (number of path−(n−1)×delay unit d) to twice or a few times the maximum burst error length corresponding to the error correction performance.

Furthermore, the controller 16 changes number of paths n or delay unit d to be greater when BER value becomes worse or continuous errors increase. More specifically, the controller 16 increases number of paths n and/or delay unit d. Thereby, the error correction performance can be improved against a long term burst error.

On the other hand, the controller 16 decreases, number of paths n and/or delay unit d when BER value becomes better. For example, if BER value is 0 (if there is no burst error), the controller 16 sets n to 1 and d to 0 so as to avoid the execution of interleaving, in other words, the controller 16 withholds the interleaving with respect to the data. Hereinafter, a state where interleaving is executable will be referred to as the interleave functioning state.

The read cache 18 temporarily stores the data from the memory 15. Furthermore, the read cache 18 outputs the data temporarily stored to the deinterleaver 19.

The deinterleaver 19 executes deinterleaving with respect to the data from the read cache 18. Furthermore, the deinterleaver 19 outputs the data subjected to deinterleaving to the error correction decoder 20.

The error correction decoder 20 decodes the data from the deinterleaver 19. Furthermore, the error correction decoder 20 outputs the decoded data to the external interface 11.

The external interface 11 outputs the data from the error correction decoder 20 to the PC 200.

Figure 2:
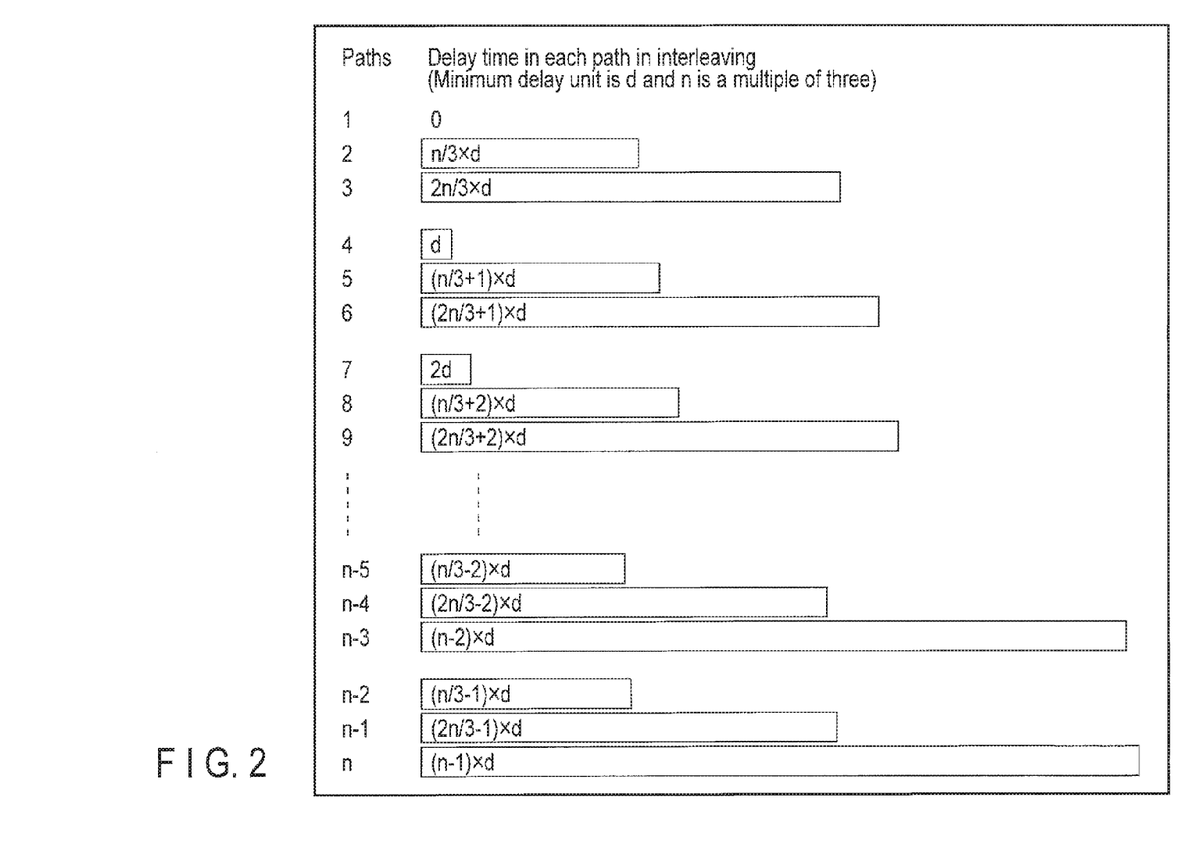
FIG. 2 shows an example of interleaving of the embodiment.
Figure 3:
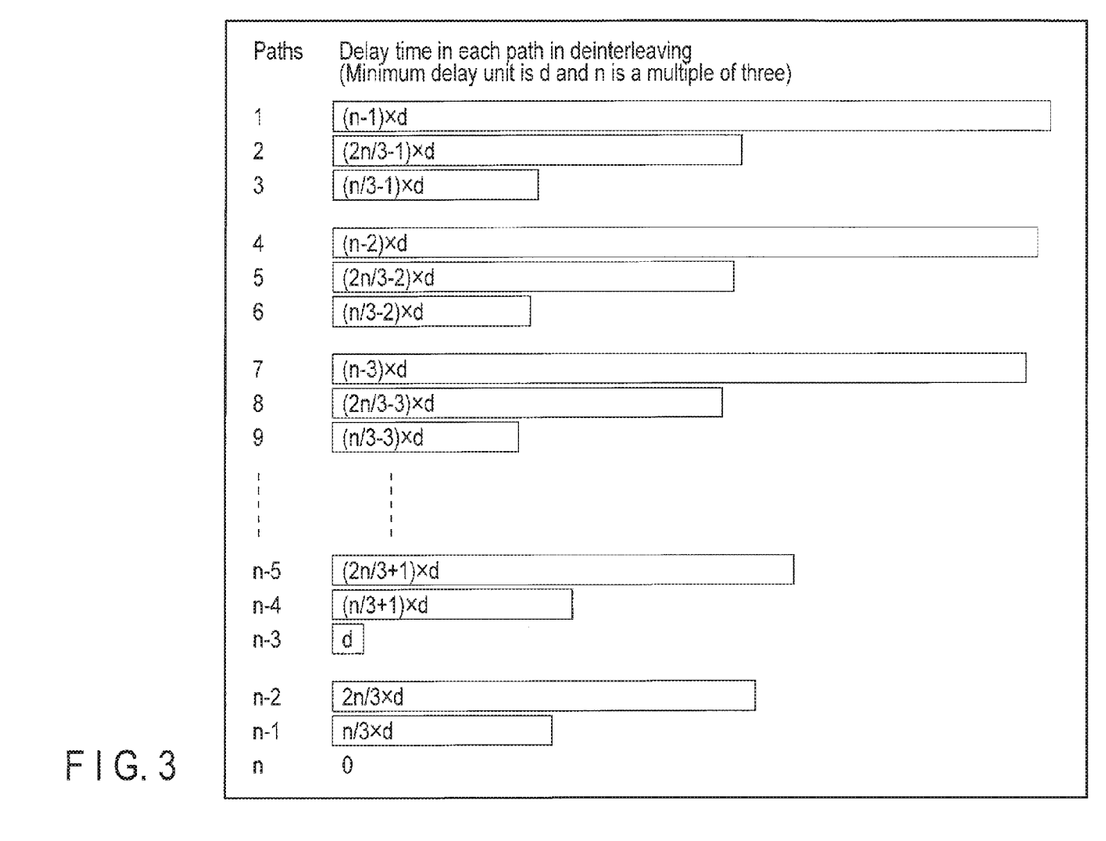
FIG. 3 shows an example of deinterleaving of the embodiment.

Now, interleaving performed by the interleaver 13 and deinterleaving performed by the deinterleaver 19 are explained in further detail with reference to FIGS. 2 and 3. Note that FIG. 2 shows three divisional interleaving and FIG. 3 shows three divisional deinterleaving. The divisor of division in both interleaving and deinterleaving may be a prime other than three, for example, five, seven, or eleven.

FIG. 2 shows an example of a process performed by the interleaver 13, and indicates that the divisor of division of divisional convolutional interleaving is number of paths is n, and total delay time Dt is (n−1)×d.

In FIG. 2, number of paths n is shown along the vertical axis and delay time of each path is shown along the transverse axis. In the present embodiment, the number of paths is n where n is a multiple of three and a minimum delay time unit is d (delay unit d).

With respect to the data from the error correction encoder 12, the interleaver 13 switches the paths from 1 to n in order based on a certain switching unit (for example, bit, byte, word and the like). Thus, the paths are switched from path 1 to path n in order and the data are input to the interleaver 13.

FIG. 3 shows an example of a process performed by the deinterleaver 19, and indicates that the divisor of division of divisional convolutional deinterleaving is 3, number of paths is n, and total delay time Dt is (n−1)×d.

In FIG. 3, number of paths n is shown along the vertical axis and delay time of each path is shown along the transverse axis. In the present embodiment, as with the interleaver 13, the number of paths is n where n is a multiple of three and a minimum delay time unit is d (delay unit d).

With respect to the data from the read cache 18, the deinterleaver 19 switches the paths in order based on a certain switching unit (for example, bit, byte, word and the like). Thus, the paths are switched from path 1 to path n in order and the data are input to the deinterleaver 19.

As shown in FIGS. 2 and 3, the delay time of each path of the interleaver 13 and the delay time of each path of the deinterleaver 19 differ from each other. Furthermore, the delay time Dt is constant in each of the paths (paths 1 to n) of both the interleaver 13 and the deinterleaver 19.

Furthermore, the relationship between the error correction code and the interleave delay in, for example, RS code RS ($\alpha$, $\beta$) is represented by setting the input to each path of the interleaver 13 to byte unit ($<\beta<\alpha$) or its integral multiple and setting a total delay time (n−1)×d to a or its integral multiple.

Furthermore, the relationship between the interleave delay, memory (for example, NAND flash memory) 15, and read cache 18 (for example, DRAM) is represented by setting approximately twice or three times the number of bits of the burst error that occurs when reading the memory 15 and read cache 18 to the total delay time Dt=(n−1)×delay unit d of the interleaver 13 and the deinterleaver 19. Note that, an actual value of the above approximately twice or three times depends on the performance of the error correction code used. When setting the total delay time Dt of the interleaver 13/deinterleaver 19 greater, the controller 16 can improve the long term burst error that occurs in reading data from the memory 15.

Figure 4:
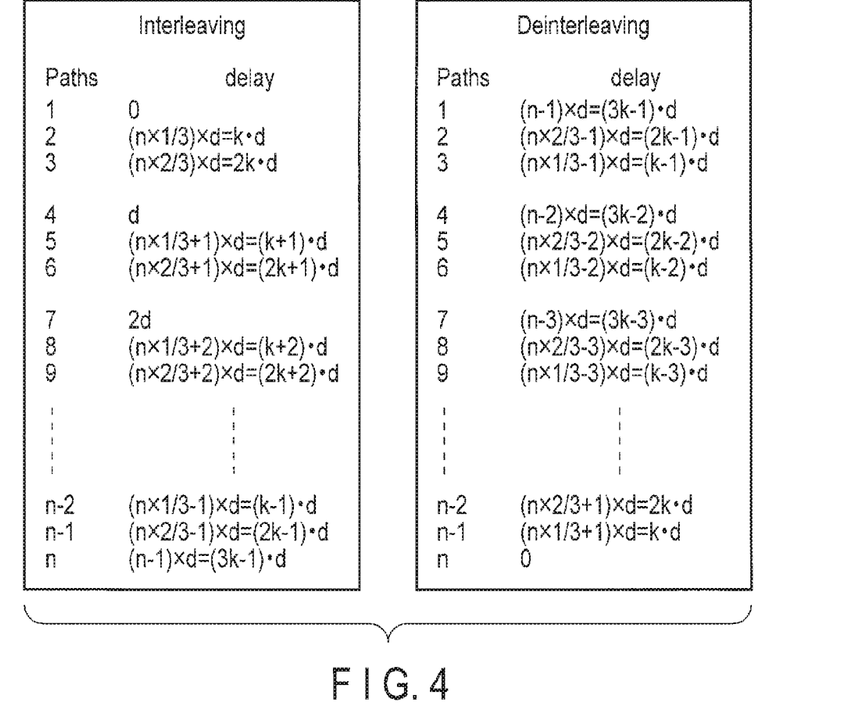
FIG. 4 is a scheme showing how a delay of each path in a three divisional interleaving and a delay of each path in a three divisional deinterleaving correspond to each other in the embodiment.

FIG. 4 is a scheme showing how the delay of each path in the three divisional interleaving and the delay of each path in the three divisional deinterleaving correspond to each other in the interleaver 13 and the deinterleaver 19.

In the scheme of FIG. 4, the parameters are set as follows.

Number of paths: n, where n is a multiple of three and n is 3 k (k is a natural number)

Input/output order of paths: P (P=1 to n), at the interleaver 13 side, delay 0 is path 1 and at the deinterleaver side, delay 0 is path n Delay unit: d (d=1, 2, 3, . . . )

Total delay time: Dt=(n−1)×d

As shown in FIG. 4, comparing the paths of the interleaver 13 to the paths of the deinterleaver 19, the sum total of the delay time Dt of the entire paths (paths 1 to n) is (n−1)×d, that is, constant.

Figure 5:
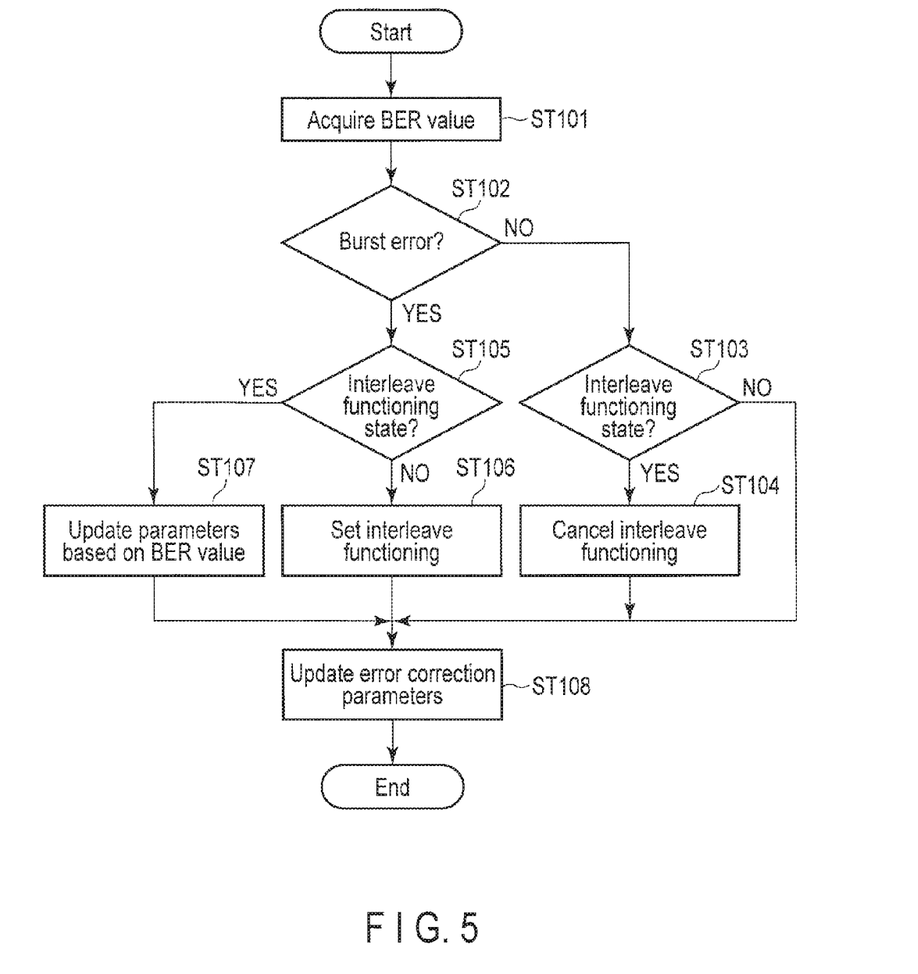
FIG. 5 is a flowchart showing an example of a process performed by a controller.

Now, the process executed by the controller 16 is explained. FIG. 5 shows an example of the process executed by the controller 16. Note that, the process explained below is performed when data containing a certain area of the memory 15 are read and data are written to the area including the certain area read. Hereinafter, for the sake of simplification, the explanation will be presented given that data are read/written from/to an optional area A.

The detector 17 detects a BER value when the data read from area A of the memory 15 are decoded by the error correction decoder 20. The detected BER value is output to the controller 16. Consequently, as shown in FIG. 5, the controller 16 acquires the BER value of area A from the detector 17 (ST101).

The controller 16 determines whether or not a burst error occurs in area A based on the BER value obtained from the detector 17 (ST102). Whether or not a burst error is in area A can be determined by checking if the BER value is greater than or equal to a predetermined value, for example. The predetermined value is a value preset for the determination of burst error. For example, when there is a random error which means that errors occur randomly or there is no error, the BER value is less than the predetermined value, and the controller 16 determines NO in step ST102.

If there is not a burst error in area A (NO in ST102), the controller 16 determines whether or not it is in the interleave functioning state (ST103). In other words, the controller 16 determines whether or not the interleaver 13 and the deinterleaver 19 are activated with respect to area A. More specifically, the controller 16 determines whether or not number of paths n of the interleaver 13 and the deinterleaver 19 is 1 and delay unit d is 0 (that is, delay time Dt is 0).

If the interleave functioning state is acknowledged in area A (YES in ST103), the controller 16 cancels the interleave function (ST104). Specifically, the controller 16 sets number of paths n to 1 and delay unit d to 0 with respect to area A (that is, delay time Dt becomes 0). Consequently, area A is released from the interleave functioning state. Here, apparently, at the time when a user starts to use the semiconductor memory device 100, a burst error is rarely detected. Thus, in the initial state of the use of the semiconductor memory device 100, data read from the memory 15 are not subjected to interleaving. The semiconductor memory device 100 can prevent an unnecessary process in this initial state. Furthermore, even if a burst error is detected in data in a certain area once but is removed from the area by some reason, the interleave functioning state can be canceled.

If the interleave functioning state is canceled (ST104), or if no interleave functioning state is acknowledged (interleave functioning is not set) (NO in ST103), the controller 16 performs the process of step ST108 as described later.

On the other hand, if there is a burst error in area A (YES in ST102), the controller 16 similarly determines whether or not it is in the interleave functioning state (ST105). If no interleave functioning state is acknowledged (interleave functioning is not set) (NO in ST105), the controller 16 sets interleave functioning (ST106). More specifically, the controller 16 sets number of paths n and delay unit d of each of the interleaver 13 and deinterleaver 19 with respect to area A based on the HER value.

Furthermore, if an interleave functioning state is acknowledged (YES in ST105), the controller 16 updates the parameters (number of paths n and delay unit d) of each of the interleaver 13 and deinterleaver 19 with respect to area A based on the BER value (ST107). More specifically, the controller 16 sets the number of paths n and delay unit d greater when the BER value becomes higher. Note that, if the BER value is not necessary to be changed, the process of step 31107 is skipped. For example, if the PER value is the same, the parameters are not necessary to change and the process of step ST107 is skipped. Note that the semiconductor memory device 100 consumes larger power in interleaving functioning state as compared to no interleaving functioning state. Furthermore, when the BER value is greater, number of paths n and delay unit d are set greater accordingly, and thus, when the PER value is greater, the semiconductor memory device 100 consumes larger power.

If determined NO in step ST103, or after the process of step ST104, ST106, or ST107, the controller 16 updates the parameters of error correction (encoder block length $\alpha$ and correction parity length $\beta$) (ST108). More specifically, the controller 16 changes the parameters (encoder block length $\alpha$ and correction parity length $\beta$) with respect to area A based on the PER value.

Now, a function of data write/read with respect to area A is explained. Hereinafter, a state where a burst error is detected in data read from area A is an error-detected state and a state where no burst error is detected in data read from area A is a non error-detected state.

If a data read instruction is provided from the PC 200 with respect to area A, the data with respect to area A are read from the memory 15, and the error correction decoder 20 decodes the data. At that time, the detector 17 detects PER of the data with respect to area A and outputs a detection result (PER value) to the controller 16.

If a burst error is detected in the data with respect to area A in the block, the controller 16 sets area A to the error-detected state, and stores the PER value at that time in, for example, a memory (which is not shown). Note that the data decoded by the error correction decoder 20 are, skipping the process by the deinterleaver 19, temporarily stored in the read cache 18 if area A has been in the non error-detected state in a previous read time and output to the PC 200 via the external interface 11.

Then, if a data write instruction is provided from the PC 200 with respect to area A, the data are input from the external interface 11 to the error correction encoder 12. The data to be written to area A are in the error-detected state as described above, the controller 16 changes the encoder block length α and correction parity length β of the error correction encoder 12 based on the BER value. The error correction code is generated based on the encoder block length α and correction parity length β.

Then, the generated error correction code is output to the interleaver 13. Here, since area A is in the error-detected state, number of paths n and delay unit d are, as described above, set in the memory by the controller 16 based on the BER value. Using these parameters, the interleaver 13 executes interleaving with respect to the data from the error correction encoder 12. The data are stored in area A of the memory 15 via the write cache 14.

Then, when the data are again read from area A, it turns to the error-detected state. Therefore, based on the instruction from the controller 16, the deinterleaver 19 executes deinterleaving with respect to the data from the read cache 18 using the same number of paths n and delay unit d as used in the process performed by the interleaver 13.

Then, the error correction decoder 20 decodes the data subjected to deinterleaving using the same encoder block length α and correction parity length β as used in the process performed by the error correction encoder 12.

The data from area A processed as above are output to the PC 200 via the external interface 11.

The semiconductor memory device 100 described above includes the interleaver 13 which performs interleaving with respect to the data output from the error correction encoder 12. Therefore, when a burst error occurs, the error can be dispersed to avoid its continuation in the data, and the error correction performance of the semiconductor memory device 100 can be improved. Consequently, changes in the condition of the memory depending on the environment used by the user can be dealt with.

Furthermore, the semiconductor memory device 100 determines whether or not there is a burst error based on the BER value detected with respect to a certain area unit, and if there is a burst error, performs interleaving with respect to the data of the certain area. That is, interleaving is not performed when, for example, a random error occurs, and thus, an error correction process of high performance can be omitted with respect to data of an area which does not require such a process of high performance.

Furthermore, the semiconductor memory device 100 can change the parameters of interleaving (number of paths n and delay unit d) in each predetermined area unit based on the BER value detected by the detector 17. Therefore, the semiconductor memory device 100 can perform suitable interleaving in each predetermined area unit based on the size of the burst error. Consequently, the semiconductor memory device 100 can apply the error correction process of high performance to an area which requires a process of high performance and an error correction process of low performance to an area which does not require a process of high performance.

Furthermore, the semiconductor memory device 100 changes, in each predetermined area unit, the parameters of error correction encoding (encoder block length and correction parity length) synchronizing with changes in the parameters of interleaving (number of paths n and delay unit d). Therefore, the semiconductor memory device 100 can effectively change the parameters.

a Note that, in the present embodiment, the controller 16 performs the determination in step ST102, that is, determining whether or not interleaving is set by checking if the BER value is equal to or greater than a predetermined value. However, no limitation is intended thereby, and the determination may be made based on other condition than the BER value. In addition to the BER value, the controller 16 may performs the determination based on, for example, the number of writes to the memory 15, refresh time interval, and integral value derived frame temperature inside the semiconductor memory device 100 and a retaining time of the temperature. Various parameters related to the semiconductor memory device 100 may be used in the determination process. Note that, the refresh time interval is a time interval required to refill the charge in the whole condensers of NAND flash memory and DRAM when they are provided with the semiconductor memory device 100. Furthermore, if a temperature inside the device is used, a thermometer may be provided to measure a temperature inside the semiconductor memory device 100 such that the controller 16 may acquires temperature data from the thermometer.

Figure 6:
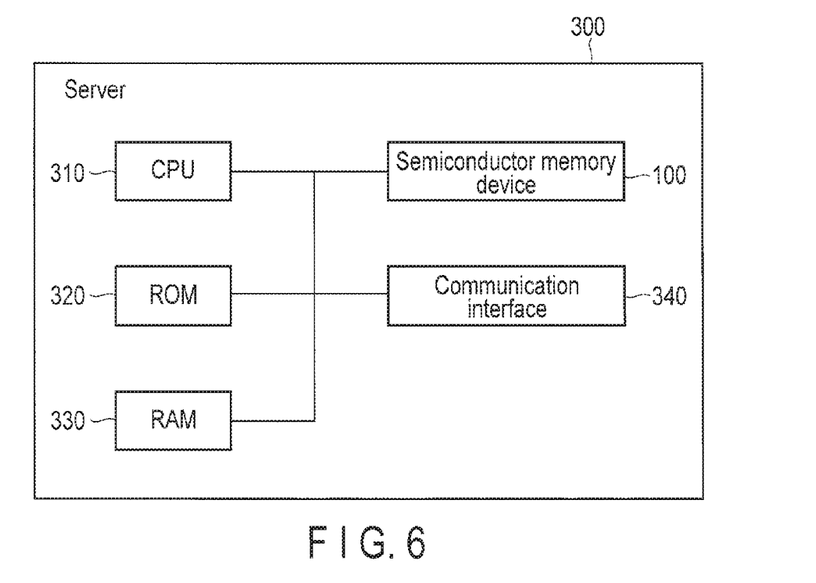
FIG. 6 is an example of a schematic structure of a device with a semiconductor device incorporated.

Moreover, the above embodiments have been described given that the semiconductor memory device 100 is applied to an external memory device of the PC 200; however, no limitation is intended thereby. The semiconductor memory device 100 can be applied to an information processor including a memory device. The information processor may be, for example, a server, personal computer, mobile device, and tablet. Note that FIG. 6 shows an example of a schematic structure of a server 300 which is an information processor with a semiconductor device 100 is incorporated. As shown in FIG. 6, the server 300 includes CPU 310, ROM 320, RAM 330, semiconductor memory device 100, and communication interface 340.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fail within the scope and spirit of the inventions.

What is claimed is:

1. A semiconductor memory device comprising:
    an encoder configured to generate an error correction code with respect to data;
    a first processor configured to perform interleaving with respect to the data from the encoder after the generation of the error correction code;
    a memory configured to store a process result from the first processor;
    a detector configured to detect a credibility value indicative of credibility of the data read from the memory; and
    a controller configured to determine whether or not the credibility value of the data read from a predetermined area of the memory is equal to or greater than a predetermined value based on a detection result from the detector, the controller configured to perform the interleaving with respect to the data read from the predetermined area if the credibility value is equal to or greater than the predetermined value and to withhold the interleaving with respect to the data read from the predetermined area if the credibility value is less than the predetermined value.

2. The semiconductor memory device of claim 1, wherein the credibility value is an error rate per unit time of the data read from the predetermined area.

3. The semiconductor memory device of claim 2, wherein the predetermined value is used to determine whether or not a burst error occurs.

4. The semiconductor memory device of claim 2, wherein the controller performs the determination using the error rate per unit time of the data, and in addition thereto, at least one of the number of writes to the memory, refresh time interval, and integral value derived from a temperature inside the semiconductor memory device and a retaining time of the temperature.

5. The semiconductor memory device of claim 1, wherein the interleaving includes the number of paths and delay unit as parameters, and the controller changes the number of paths and the delay unit depending on the credibility value.

6. The semiconductor memory device of claim 1, further comprising a decoder configured to decode the encoded data read from the memory.

7. The semiconductor memory device of claim 6, further comprising a second processor configured to perform deinterleaving with respect to the encoded data before the decoder performs decoding.

8. The semiconductor memory device of claim 1, wherein the encoder includes a code length and parity as parameters, and the controller changes the parity length depending on a change in the code length.

9. The semiconductor memory device of claim 8, wherein the interleaving includes the number of paths and delay unit as parameters, the controller changes the number of paths and the delay unit depending on the credibility value, and the code length and the parity length change in synchronization with the number of paths and the delay unit.

10. An information processing apparatus comprising a semiconductor memory device, the device comprising:
an encoder configured to generate an error correction code with respect to data;
a first processor configured to perform interleaving with respect to data from the encoder after the generation of the error correction code;
a memory configured to store a process result from the first processor;
a detector configured to detect a credibility value indicative of credibility of the data read from the memory; and
a controller configured to determine whether or not the credibility value of the data read from a predetermined area of the memory is equal to or greater than a predetermined value based on a detection result from the detector, the controller configured to perform the interleaving with respect to the data read from the predetermined area if the credibility value is equal to or greater than the predetermined value.

11. A semiconductor memory device comprising:
an encoder configured to generate an error correction code with respect to data;
a processor configured to perform interleaving with respect to the data output from the encoder after the generation of the error correction code by the encoder;
a memory configured to store a process result from the processor;
a detector configured to detect a mean value of an error data per unit time with respect to data read from a predetermined area of the memory; and
a controller configured to execute the processor based on the mean value detected by the detector.

12. The semiconductor memory device of claim 11, wherein the processor includes the number of paths and delay unit as parameters, and the controller changes the number of paths and delay unit based on the detection result.

* * * * *